United States Patent [19]

Siden

[11] 3,925,596

[45] Dec. 9, 1975

[54] HEAT RECOVERABLE CONNECTORS

[75] Inventor: Dennis C. Siden, Sunnyvale, Calif.

[73] Assignee: Raychem Corporation, Menlo Park, Calif.

[22] Filed: Mar. 1, 1973

[21] Appl. No.: 337,138

Related U.S. Application Data

[63] Continuation-in-part of Ser. No. 261,788, June 12, 1972, abandoned.

[52] U.S. Cl. .................. 174/68.5; 29/626; 29/628; 174/DIG. 8; 174/88 R; 339/17 C; 339/275 B

[51] Int. Cl. .......................................... H05k 1/18

[58] Field of Search .......... 174/DIG. 8, 84 R, 88 R, 174/88 C, 75 C, 68.5; 29/626, 628; 339/17 R, 275 B, 275 T

[56] References Cited

UNITED STATES PATENTS

| | | | |
|---|---|---|---|
| 3,708,611 | 1/1973 | Dinger | 174/DIG. 8 X |
| 3,743,748 | 7/1973 | Reeder | 174/DIG. 8 X |

*Primary Examiner*—Darrell L. Clay
*Attorney, Agent, or Firm*—Lyon & Lyon

[57] ABSTRACT

A device for forming a mechanical and electrical connection between two or more conductors utilizing a heat recoverable member which contains a conductor such as a conductive bus. The heat recoverable member has at least one unrecovered open end within which is located the conductive bus. In an embodiment, the conductive bus extends beyond the heat recoverable member and is attached to a desired location such as a printed circuit board. To electrically connect a second conductor to the portion of the printed circuit board to which the conductive bus has been attached, one need merely to insert a bared end of a second conductor into an open end of the heat recoverable member and shrink the heat recoverable member against the two conductors. Preferably, a portion of solder is also located within the open end to improve the electrical connection. This same device may also be used to terminate two or more conductors to a printed circuit board or to each other. The device may be mounted in a conventional manner on an insulative board and used as a splicing means. A plurality of such devices may be attached to a tape to facilitate assembly or the automatic insertion of the devices in printed circuit boards.

20 Claims, 12 Drawing Figures

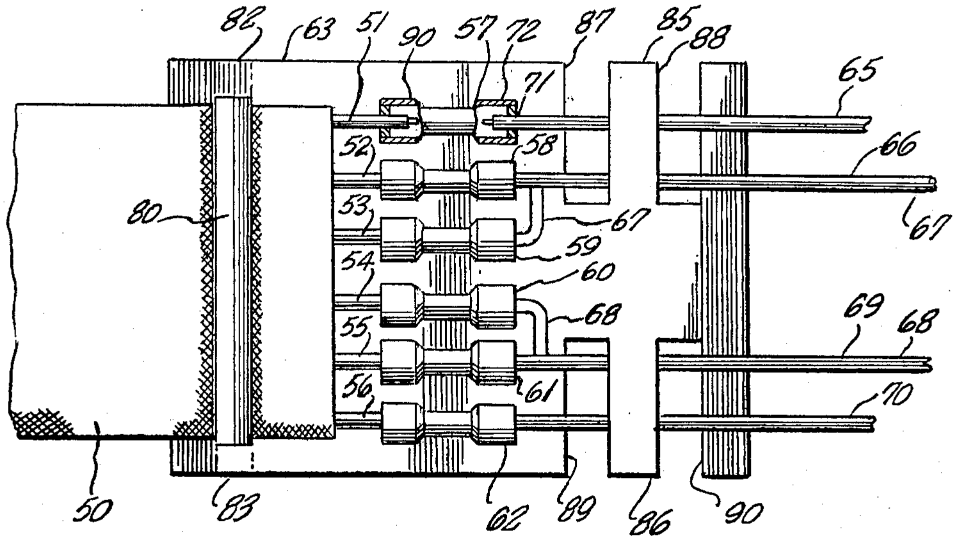
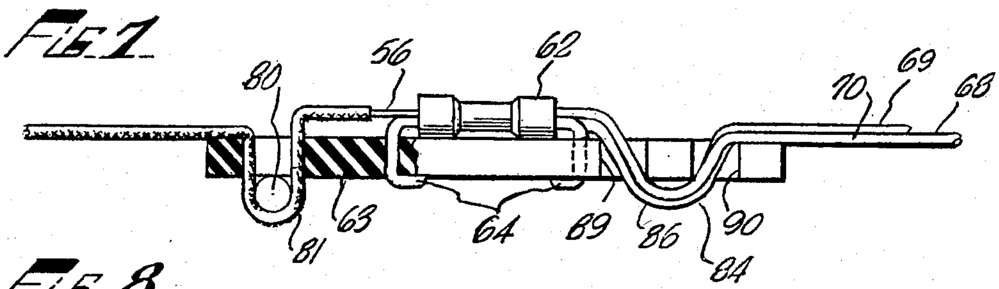
FIG. 7
FIG. 8
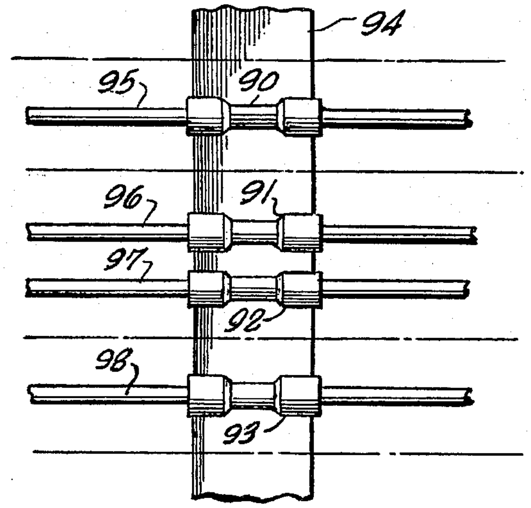
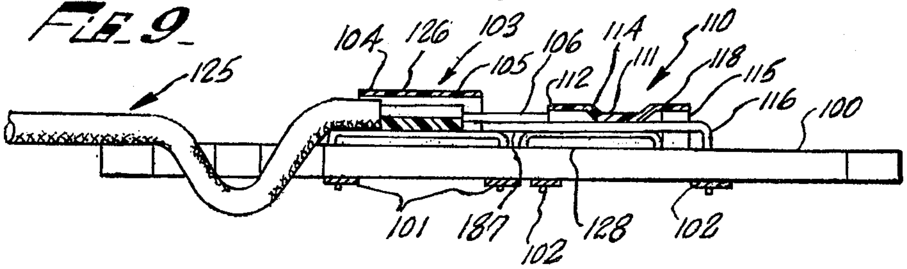
FIG. 9

HEAT RECOVERABLE CONNECTORS

BACKGROUND OF THE INVENTION

This is a continuation-in-part of now abandoned application Ser. No. 261,788 filed June 12, 1972.

The field of the invention relates to connectors which are capable of forming a mechanical and electrical connection between two or more objects. Widely used connection means include a pin and socket connection, a soldered connection, a nut and bolt connection, and a wide variety of crimped connections. More particularly, an embodiment of the invention relates to devices capable of forming electrical connection to a printed circuit board, another embodiment of the invention relates to forming a splicing device adapted to be attached in any conventional manner to a printed circuit or to an insulative board. The invention further relates to devices capable of forming an electrical connection to a flat conductor.

Numerous methods have been used to electrically connect a conductor to a printed circuit board. While the direct soldering of a conductor which has been inserted through a hole in a printed circuit board to the conductive portion of that board is satisfactory for many connections, it is often difficult to form such a connection with a flat stranded conductor. Furthermore, such a method requires excessive hand labor in the areas of wire sorting, and insertion, hand soldering, cleaning, conformal coating, and strain relief. There is a need for a device which can be pre-inserted into a printed circuit board, mass soldered in place, which device permits the later convenient termination of a conductor to the printed circuit board. There is also a need for a device which can splice a plurality of flat conductors or cables to a plurality of conventional wire conductors.

SUMMARY OF THE INVENTION

It is thus an object of the present invention to provide a termination device capable of forming an electrical connection between at least two conductors.

It is another object of the present invention to provide a termination device for forming an electrical connection between a conductor and a printed circuit board.

The present invention is for a termination device useful for making an electrical and mechanical connection between at least two conductors. The device, in an embodiment, has a hollow, heat recoverable member having at least one open end and a conductive bus protruding from the member. Preferably, a portion of solder is located within every open end so that a bared conductor which is inserted within any open end and against the bus will be soldered to the bus by the heating and shrinking of the heat recoverable member and the melting of the solder. When the heat recoverable member is of a length of cylindrical sleeving having its central portion shrunk against the conductive bus, which is a length sufficient to protrude from both unrecovered open ends, a particularly effective device results. When a plurality of such devices are attached to a tape, they may be readily adapted for automatic or mechanical insertion, and mass soldering to a printed circuit board or may be automatically clinched to an insulative board when the device is used for splicing. Conductors may then be terminated to the printed circuit board or spliced together at a later time by inserting them in the open ends of the devices and heating the devices to cause shrinking and if provided with a portion of solder, to further cause soldering. The device is further useful in that it is capable of terminating flat as well as round conductors.

Figures 4, 4A, 5:
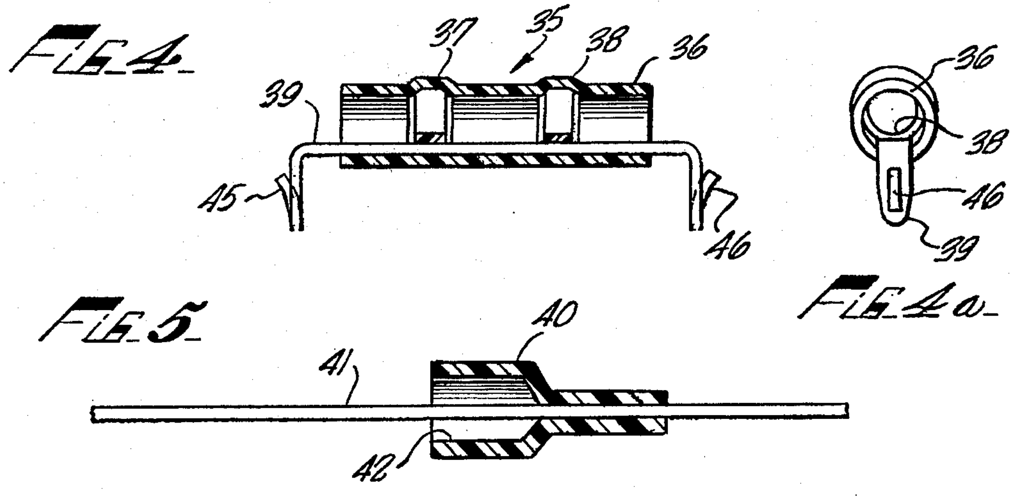
FIG. 4 is an exemplary embodiment of a side elevation, partly in cross section of a device in accordance with this invention.

FIG. **4*a* is an end view of the device of FIG. 4** in accordance with this invention.

FIG. 5 is an exemplary embodiment of a side elevation, partly in cross section, in accordance with this invention.

FIG. 6 is an exemplary embodiment of a plan view, partly in cross section, of a plurality of devices having a plurality of conductors inserted in each open end of said devices in accordance with this invention.

FIG. 7 is a side elevation, partly in cross section, of the article of FIG. 6 in accordance with this invention.

FIG. 8 is an exemplary embodiment of a plan view of a plurality of devices attached to a tape in accordance with this invention.

FIG. 9 is an exemplary embodiment of a side elevation, partly in cross section, of a plurality of devices adapted for termination to a coaxial cable in accordance with this invention.

Figure 10:
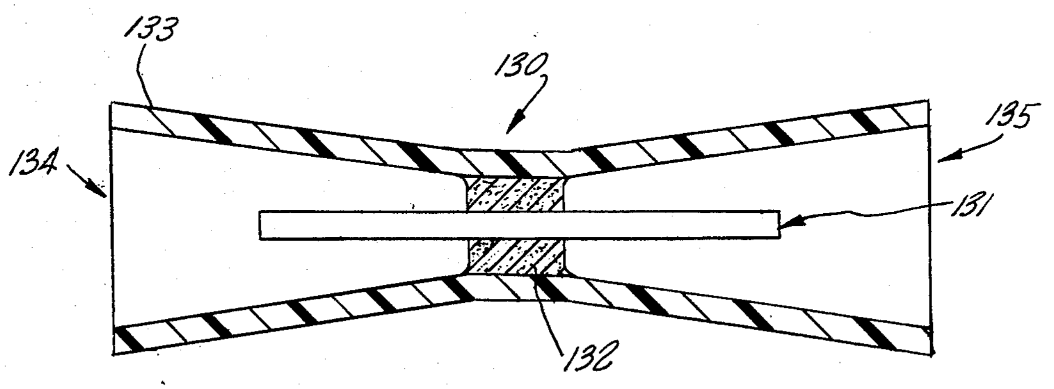

FIG. 10 is an exemplary embodiment of a side elevation, partly in cross section of a device in accordance with this invention.

Figure 11:
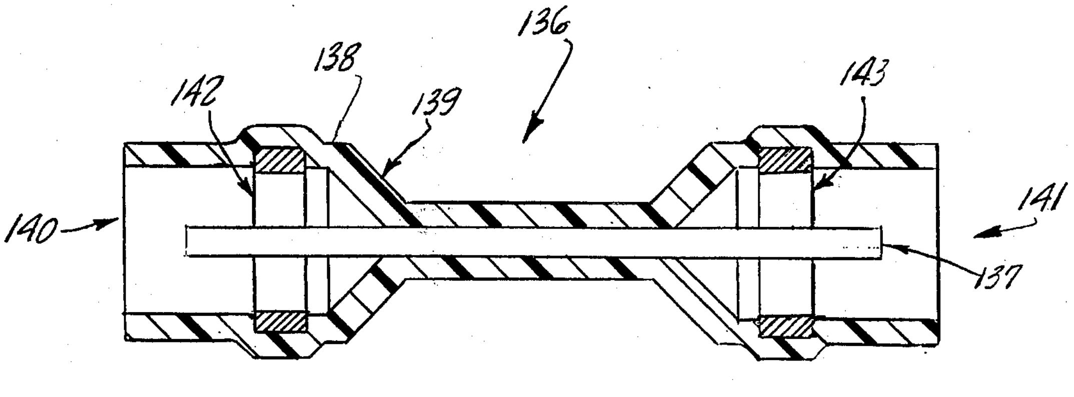

FIG. 11 is an exemplary embodiment of a side elevation, partly in cross section of a device in accordance with this invention.

DESCRIPTION OF THE PREFERRED EMBODIMENTS

Figure 1:
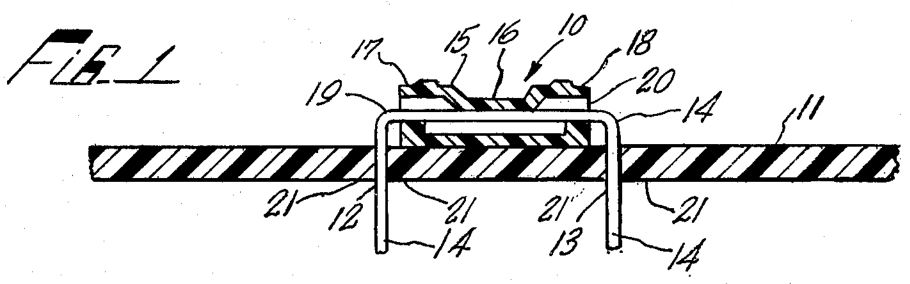
FIG. 1 is a side elevation partly in cross section, of an exemplary embodiment of a termination device inserted through a printed circuit board in accordance with this invention.

A device made according to the present invention is shown in FIG. 1 and generally indicated by reference character 10. A printed circuit board 11 has a conductive trace 21 and has two holes 12 and 13 through which a conductive bus 14 has been inserted. The conductive bus 14 is attached to a heat recoverable sleeve 15 which has a centrally located heat recovered portion 16 which serves to attach conductive bus 14 to sleeve 15. Means for forming heat recoverable members are well known and examples of such methods are disclosed in Currie U.S. Pat. No. 2,027,962 and Cook, et al., U.S. Pat. No. 3,086,242, the disclosures of which are incorporated herein by reference. Sleeve 15 has two unrecovered open ends 17 and 18, each of which contain a ring of solder 19 and 20.

Figure 2:
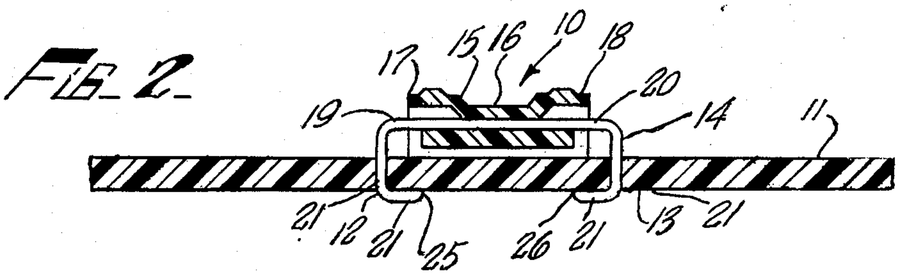
FIG. 2 is a side elevation, partly in cross section, of the device of FIG. 1 soldered to a printed circuit board in accordance with this invention.

The device of FIG. 1 is shown after connection of the bus 14 to a printed circuit board trace 21 in FIG. 2. The connection is formed by bending conductive bus 14 inwardly and, if necessary, removing an unneeded portion of bus 14. The bent portion of bus 14 is then soldered by conventional means, such as wave soldering, dip soldering or hand soldering, the solder being indicated in FIG. 2 by reference characters 25 and 26. The device is now ready for the electrical connection of a conductor to the conductive bus 14.

Figure 3:
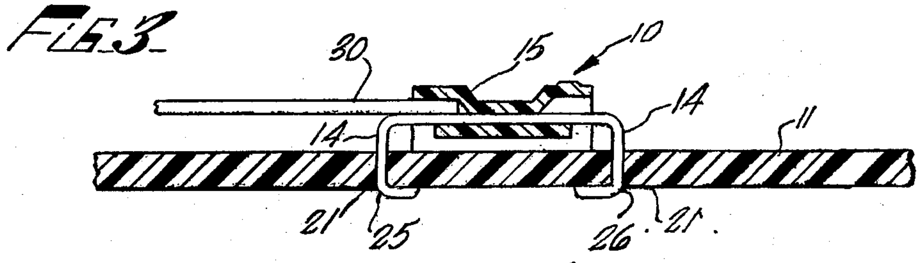
FIG. 3 is a side elevation, partly in cross section, of the device of FIG. 1 after heat recovery to one end of a conductor in accordance with this invention.

The termination of a conductor is shown in FIG. 3 where a bared conductor 30 has been terminated to conductive bus 14. This connection is carried out by the insertion of the bare conductor 30 into the open end 17 of the device 10 followed by the heating of end 17. The heating causes a melting of the ring of solder 19. The ring of solder 19 flows against the conductive bus 14 and the bared conductor 30 and electrically joins these two conductive members together and thus connects conductor 30 to conductive trace 21 of printed circuit board 11. Similarly, another bared conductor could be connected to bus 14 by its insertion into open end 18 followed by heating.

A connector of the configuration of the device 10 shown in FIGS. 1 through 3 can be utilized to splice two conductors together. When so used, it is not necessary that printed circuit board 11 have a conductive portion 21. For instance, bus 14 could merely be clinched in a manner shown in FIG. 2 to a board fabricated from an insulator material. Bared conductors could then be inserted in open ends 17 and 18 and the connector heat recovered against these two conductors.

Turning now to FIG. 4, an exemplary embodiment of the device of the present invention is indicated by reference character 35. The device 35 comprises a heat recoverable sleeve 36 which has two rings of solder 37 and 38 held therein. A conductive bus 39 is held against sleeve 36 by rings 37 and 38. Bus 39 has a rectangular cross section having two protrusions 45 and 46 which facilitate connection of the device to a printed circuit or insulative board. The device may be used in a manner analogous to the device shown in FIGS. 1 through 3 or can be attached to an insulative board and used as a splicing device as described below.

A heat recoverable member 40 is shown recovered over a conductive bus 41 in FIG. 5. The open end 42 of heat recoverable member 40 has not yet been heat recovered and thus the device is capable of operating in a manner similar to that described for the FIGS. 1 through 3. No solder is provided within the open end of member 40. The device, as for the other devices in the drawings is capable of making a mechanical and electrical connection without the presence of solder although solder generally results in an improved connection. The device of FIG. 5 is connected to a board by connection of bus 41 to the board and then it may be used to connect a plurality of conductors inserted in its open end.

Turning now to FIGS. 6 and 7, a plurality of devices of the present invention are used to terminate a plurality of separate conductors 65 through 70 to the conductors in a flat cable 50. Flat cable 50 has a plurality of flat, rectangular conductors 51 through 56 which are imbeded in the insulation of cable 50. The device can equally well be used for the termination of a cable having round conductors. Each conductors is inserted into one open end of devices 57 through 62. As shown in FIG. 7, each device is clinched to insulative board 63 by conductive bus 64. Insulated conductors 65 through 70 are inserted into the remaining open ends of devices 57 through 62. The end of each conductor has been stripped as shown in broken away portion of device 57 where bared end 71 is shown within an open end of device 57. Each of devices 57 through 62 has a solder ring in each end such as solder rings 72 and 90 shown in the broken away portions of device 57. The connecting device of FIGS. 6 and 7 also provides two different means for strain relief. The flat cable is provided with strain relief by the insertion of a rod 80 through a loop 81 formed in flat cable 50. Rod 80 is thus supported by loop 81 and by contact with insulative board 63 at its end at points indicated in the drawings by reference characters 82 and 83. Strain relief for insulated conductors 65 through 70 is provided by a loop formed in each conductor as shown most clearly in FIG. 7 by loop 84 formed in conductor 70. This loop is readily formed by bending conductors 65 through 67 under arm 85 which is formed by slot 87 and 88 made in insulative board 63. Similarly, conductors 68 through 70 are looped under arm 86 formed between slots 89 and 90 in board 63. To complete the connection, devices 57 through 62 are heated to cause a shrinking of the heat recoverable sleeve and a melting of the solder rings. This results in an electrical contact between the paired conductors. For instance, an electrical connection is completed through conductor 51, the conductive bus within device 57, and the bared end 71 of conductor 65.

If the insulative board 63 was instead a printed circuit board with a printed conductive trace, the conductive bus could further be soldered to provide an electrical connection between it and the conductive portion of the board.

The devices of the present invention may be readily packaged to facilitate the automatic insertion into printed circuit boards. Such packaging is shown in FIG. 8 where devices 90 through 93 are adhered to tape 94. A conventional adhesive may be used for this purpose. Each device has a conductive bus 95 through 98, the function of which is described above. The devices shown in FIG. 8 may then be bent into the final desired configurations such as that shown for device 62 in FIG. 7. Such bending can be formed readily by automatic equipment, and furthermore, the insertion into a printed circuit board, the cutting and the clinching may likewise be readily automated when the devices are supplied on a tape. The tape may alternatively be adhered to the conductive busses rather than to the heat recoverable members.

The devices of the present invention can be installed in printed circuit boards and used as insulated jumpers when printed circuit board traces become too complex to get the entire connection system on one side of the board. Thus, the devices of the present invention may be used to relieve printed circuit board design problems, and may make it unnecessary to go to the expense of double sided circuitry.

The devices of the present invention may also be adapted for termination of a coaxial cable to a printed circuit board. Such a device is shown in FIG. 9 where printed circuit board 100 has one set of conductive traces 101 and a second set of conductive traces 102. Device 103 has a heat recoverable sleeve 104 within which is held a ring of solder 105. A conductive bus 106 is inserted through board 100 and soldered to conductive traces 101. Similarly, device 110 includes a heat recoverable sleeve 111 with two unrecovered ends 112 and 113. Each end has inserted therein a solder ring such as rings 114 and 115, respectively. A conductive bus 116 is soldered to conductive traces 102. In operation, coaxial cable 125 is inserted through device 103 and has a portion of its braided shield 126 exposed within device 103. The insulative center conductor 127 exits device 103 and is inserted into end 112 of device 110. The bared center conductor 128 extends through solder ring 114 in open end 112. In operation, devices 103 and 110 are heated to cause shrinking, and the melting of the solder rings, thereby soldering the braided shield 126 to conductive bus 106. In a like manner, the bared center conductor 128 is soldered to conductive bus 116 and thereby electrically connected to conductive traces 102 when device 110 is heated.

Referring now to FIG. 10, there is illustrated a device generally indicated by reference character 130. In device 130, a solid conductive bus 131 is placed through a premeasured quantity of centrally located solder and flux or solder unit 132. Surrounding the solder unit 132 and the conductive bus 131 is a heat recoverable sleeve 133. The solder 132 may readily be held in place by shrinking a central portion of the heat recoverable sleeve 133. Sleeve 133 has two unrecovered open ends 134 and 135 which are tapered to provide a large target for easy insertion of conductors to be spliced.

To provide a splice between two conductors, a first bared conductor is inserted through open end 134, and a second bared conductor is inserted through open end 135. The solder unit 132 forms a bulkhead which provides a stop to help prevent over or under insertion of the bared conductors. After the bared conductors are inserted in the device 130, the assembly is heated causing the sleeve 133 to be recovered and the solder unit 132 to flow thereby resulting in a soldered and insulted splice. The device 130 may be attached or fastened to a desired location, such as a circuit board, either before or after recovery of the sleeve 133 by many known techniques (e.g., a clip).

Referring now to FIG. 11 there is illustrated a device generally indicated by reference character 136. In device 136, a conductive bus 137 is attached to a heat recoverable sleeve 138 which has a centrally located heat recovered portion 139 which serves to attach the conductive bus 137 to the sleeve 138. Sleeve 138 has two unrecovered ends 140 and 141 which (as is true for all the embodiments herein described) may be tapered for ease of assembly. Each end 140 and 141 contains a ring of solder or the like, such as solder rings 142 and 143, respectively.

To provide a splice between two conductors, a first bared conductor is inserted through open end 140 and solder ring 142, and a second bared conductor is inserted through open end 141 and solder ring 143. After the bared conductors are inserted in the device 136, the ends 140 and 141 are heated thus causing the ends to recover and the solder rings 142 and 143 to melt against the bared conductors and the conductive bus 137, thereby resulting in a soldered and insulated splice.

As in FIG. 10, the device 136 may be attached or fastened in a desired location by a manner known in the art. Also, as in FIG. 10, the device 136 may readily be adhered to tape to facilitate packaging and assembly.

Although the device of the present invention has been described largely with respect to the use of rings of solder, the devices need not be so equipped and instead a ribbon of solder or a sphere or solder could be provided within the device or any other configuration of solder could be used which would not interfere with the insertion of a bared conductor within the device and yet provide a supply of solder. Examples of heat recoverable members having solder therein are shown in U.S. Pat. No. 3,396,460 issued to Wetmore and assigned to the assignee of the present invention. The disclosure of this patent is incorporated by reference herein. Furthermore, for some applications it may not be necessary to use solder where, for instance, a simple surface to surface contact would provide acceptable conduction.

Although the conductive bus is readily held by shrinking a central portion of the heat recoverable member, it need not be so held and may, instead, be held by an adhesive, by clip means, or by a protrusion in the bus which would form a frictional fit within the device. The devices need not be formed from a heat recoverable cylindrical sleeve, but instead could be formed in a different shape such as a rectangular parallel pipe. Furthermore, a plurality of such devices could be molded in one rectangular parallel pipe.

While the heat recoverable member can most easily hold the conductive bus by shrinking into direct contact with the bus, it is sometimes impossible or impractical to shrink the sleeve into direct contact with the bus. For instance, when the sleeve has a relatively large diameter, it may not be capable of shrinking an amount sufficient to contact a bus of small diameter. It may thus be desirable to add a spacer between the bus and sleeve. Such spacer may be another smaller diameter length of heat recoverable tubing, an inert spacer or the like. Thus, when it is stated that the sleeve is holding the conductor, this is intended to include those devices utilizing a spacing means.

The present embodiments of this invention are thus to be considered in all respects as illustrative and not restrictive, the scope of the invention being indicated by the appended claims rather than by the foregoing description. All changes which come within the meaning and range of equivalency of the claims therefore are intended to be embraced therein.

I claim:

1. A termination device useful for making a connection between at least two conductors, said device comprising:

- a hollow, heat-recoverable member having at least two unrecovered open ends; and
- a conductor held within said member having a portion thereof extending outside of at least two of said unrecovered open ends.

2. The device of claim 1 wherein said member is cylindrical in shape at each open end.

3. The device of claim 1 wherein said conductor is held within said member by a heat recovered portion of said member.

4. A termination device useful for making a soldered connection between at least two conductors, said device comprising:

- a hollow, heat recoverable sleeve having at least two open ends;
- a conductive member within said sleeve, the ends of said conductive member extending outside of said two open ends; and
- a portion of solder means positioned within said sleeve.

5. The device of claim 4 wherein said solder means comprises a cylindrically shaped length of a solder alloy.

6. The device of claim 4 wherein said solder means comprises two cylindrically shaped lengths of a solder alloy positioned near each of said open ends of said sleeve.

7. The device of claim 6 wherein said conductive member is held in said sleeve by a heat recovered portion of said sleeve.

8. The device of claim 6 wherein said conductive member is held in said sleeve by contact with said lengths of a solder alloy.

9. A termination device for connecting a plurality of conductors comprising:

an elongated tape means;

a plurality of heat recoverable sleeves attached to said tape means, each of said sleeves having a conductive member inserted therethrough, which conductive member extends outside of each end of each sleeve; and means for holding each conductive member within each sleeve.

10. The device of claim 9 wherein said means for holding said conductive member within each sleeve comprises a central heat recovered portion of said sleeve contacting said conductive member.

11. A termination device useful for making an electrical and a mechanical connection between at least two conductors, said device comprising:

a hollow heat recoverable member unrecovered at a first end and recovered at a second end; and a conductor held within said member by a heat recovered portion of said member, said conductor having at least a portion thereof extending outside of said first and second ends of said member.

12. A device for terminating a coaxial cable to a printed circuit board comprising:

a first heat recoverable sleeve having a first conductive bus extending through each open end thereof, said first bus being electrically connected to that portion of said printed circuit board to which a shield portion of a coaxial cable is to be connected, the inside dimensions of said sleeve being sufficiently large to permit the passage therethrough of a stripped shield portion of a coaxial cable;

solder means within said first heat recoverable sleeve;

a second heat recoverable sleeve having a second conductive bus extending through each open end thereof, said second bus being electrically connected to that portion of said printed circuit board to which a center conductor of a coaxial cable is to be connected, the inside dimension of at least one end of said second sleeve being sufficiently large to permit the passage therein of a stripped center conductor of a coaxial cable; and solder means within said second sleeve.

13. A device for joining a multconductor flat insulated cable to a plurality of conductors, said device comprising:

an insulative board;

a plurality of heat recoverable sleeves each attached in parallel alignment by separate respective conductive buses passing through each of said sleeves and secured to said board, each of said sleeves being open at each end and being provided with solder means near each open end.

14. The device of claim 13 further including a slot in a member connected to said insulative board for relieving the mechanical strain of each of the plurality of conductors.

15. The device of claim 13 further including a slot for relieving mechanical strain wherein said slot is in an integral portion of said insulative board and is an elongated opening formed in said insulative board.

16. The device of claim 15 wherein said integral portion has a plurality of said slots therein each of which is an elongated opening formed in said insulative board.

17. A device for making a connection between two bared conductors comprising:

a hollow member having first and second heat recoverable end portions, each admitting of the passage of a bared conductor into said member;

a conductive elongated bus entirely within said member, the respective ends of said bus lying completely within said end portions; and a third portion of said member between said end portions being recovered about said bus, so as to hold said bus within said member;

wherein a portion of solder is disposed between said bus and said third portion.

18. The device of claim 17 wherein said solder is centrally located within said member.

19. The device of claim 17 wherein said first and second end portions of said member are tapered.

20. A device for making a connection between two bared conductors comprising:

a hollow member having first and second heat recoverable end portions, each admitting of the passage of a bared conductor into said member;

a conductive elongated bus entirely within said member, the respective ends of said bus lying completely within said end portions; and a third portion of said member between said end portions being recovered about said bus, so as to hold said bus within said member;

said device further including a first and second solder means located in said first and second end portions of said member respectively.

* * * * *